US012566223B2

(12) United States Patent
Kawano et al.

(10) Patent No.: US 12,566,223 B2
(45) Date of Patent: Mar. 3, 2026

(54) MAGNETIC DETECTION DEVICE

(71) Applicant: AICHI STEEL CORPORATION, Tokai (JP)

(72) Inventors: Takeshi Kawano, Aichi (JP); Shiori Itabuchi, Aichi (JP)

(73) Assignee: AICHI STEEL CORPORATION, Tokai (JP)

( * ) Notice: Subject to any disclaimer, the term of this patent is extended or adjusted under 35 U.S.C. 154(b) by 176 days.

(21) Appl. No.: 18/695,536

(22) PCT Filed: Sep. 21, 2022

(86) PCT No.: PCT/JP2022/035129
§ 371 (c)(1),
(2) Date: Mar. 26, 2024

(87) PCT Pub. No.: WO2023/063036
PCT Pub. Date: Apr. 20, 2023

(65) Prior Publication Data
US 2024/0288514 A1 Aug. 29, 2024

(30) Foreign Application Priority Data

Oct. 15, 2021 (JP) ................................. 2021-169590

(51) Int. Cl.
*G01R 33/00* (2006.01)
*G01R 33/06* (2006.01)
(52) U.S. Cl.
CPC ....... *G01R 33/0041* (2013.01); *G01R 33/063* (2013.01)
(58) Field of Classification Search
CPC .. G01R 33/0041; G01R 33/063; G01R 33/09; G01R 33/0915; G01R 33/085;
(Continued)

(56) References Cited

U.S. PATENT DOCUMENTS

| | | | |
|---|---|---|---|
| 4,290,018 A | 9/1981 | Rhodes | |
| 6,984,989 B2 | 1/2006 | Kudo et al. | |
| (Continued) | | | |

FOREIGN PATENT DOCUMENTS

| | | |
|---|---|---|
| CN | 101738587 A | 6/2010 |
| JP | 2002-198582 A | 7/2002 |
| (Continued) | | |

OTHER PUBLICATIONS

Written Opinion issued Nov. 29, 2022, in PCT/JP2022/035129, 3 pages.

(Continued)

*Primary Examiner* — Lee E Rodak
*Assistant Examiner* — Taqi R Nasir
(74) *Attorney, Agent, or Firm* — Oblon, McClelland, Maier & Neustadt, L.L.P.

(57) ABSTRACT

A magnetic detection device includes a magnetoimpedance sensor element, a main operational amplifier whose input terminals are connected to a first end and a second end of a detection coil, a first feedback circuit that is connected between an output terminal of the main operational amplifier and the first end of the detection coil and is configured to generate a first feedback voltage, and a second feedback circuit that is connected between the output terminal of the main operational amplifier and the second end of the detection coil and is configured to generate a second feedback voltage with a polarity that inverts a polarity of the first feedback voltage with respect to a predetermined reference voltage as a baseline.

10 Claims, 7 Drawing Sheets

(58) Field of Classification Search
CPC .... G01R 33/0933; G01R 33/10; G01R 33/00; G01R 19/165
USPC ................. 324/207.21, 236, 252, 76.49, 260
See application file for complete search history.

(56) References Cited

U.S. PATENT DOCUMENTS

| | | | |
|---|---|---|---|
| 7,405,559 B1 * | 7/2008 | Hagerty | ................. G01R 33/18 324/249 |
| 7,746,973 B2 | 6/2010 | Saito et al. | |
| 9,261,571 B2 | 2/2016 | Schaffer et al. | |
| 9,684,039 B2 | 6/2017 | Schaffer et al. | |
| 9,739,849 B2 | 8/2017 | Yamamoto et al. | |
| 2008/0292044 A1 | 11/2008 | Saito et al. | |
| 2015/0048820 A1 | 2/2015 | Schaffer et al. | |
| 2015/0219731 A1 * | 8/2015 | Yamamoto | ........... G01R 33/063 324/252 |
| 2016/0161571 A1 | 6/2016 | Schaffer et al. | |
| 2018/0305875 A1 | 10/2018 | Yamamoto et al. | |
| 2023/0333177 A1 | 10/2023 | Yamamoto et al. | |

FOREIGN PATENT DOCUMENTS

| | | | | | |
|---|---|---|---|---|---|
| JP | 2008-292325 | A | | 12/2008 | |
| JP | 2014-29323 | A | | 2/2014 | |
| JP | 2014029323 | A | * | 2/2014 | ........... G01R 33/063 |
| JP | 5924503 | B2 | | 5/2016 | |
| JP | 6223674 | B2 | | 11/2017 | |
| JP | 2019-184240 | A | | 10/2019 | |
| WO | WO 2017/061513 | A1 | | 4/2017 | |
| WO | WO 2022/070842 | A1 | | 4/2022 | |

OTHER PUBLICATIONS

Taiwanese Office Action issued Sep. 5, 2025 in Taiwanese Patent Application No. 111137175 (with unedited computer-generated English Translation), 9 pages.
International Search report issued Nov. 29, 2022 in PCT/JP2022/035129, filed on Sep. 21, 2022, 3 pages.
Extended European Search Report issued May 28, 2024, in corresponding European Patent Application No. 22880732.7, 5 pages.

* cited by examiner (a)    $I_{IN}$ (b)    Vs1

(f)     $V_{FB}$     ΔVy (g)     $I_{FB}$ (h)     $B_{FB}$ (i)     $B_{ACT}$

MAGNETIC DETECTION DEVICE

CROSS REFERENCE TO RELATED APPLICATIONS

This application is a National Stage entry under 35 U.S.C. § 371 of PCT/JP2022/035129, filed on Sep. 21, 2022, and claims priority to JP Patent Application No. 2021-169590, filed on Oct. 15, 2021, the entire contents of which are incorporated herein by reference.

TECHNICAL FIELD

The present invention relates to a magnetic detection device.

BACKGROUND ART

Patent Literature 1 discloses a magnetic detection device that detects the strength of a detection target magnetic field using an amorphous magnetic wire and a detection coil as a magnetic sensitive body. The amorphous magnetic wire has a property of causing a magnetoimpedance effect (MI effect). That is, the amorphous magnetic wire has a property of causing a magnetization change corresponding to the strength of the magnetic field acting on the amorphous magnetic wire when an excitation current is supplied. More specifically, the impedance of the amorphous magnetic wire changes as the permeability in the circumferential direction changes corresponding to the strength of the magnetic field acting thereon. The detection coil is wound around the amorphous magnetic wire, and outputs an induced voltage caused by a magnetization change of the amorphous magnetic wire.

The excitation current supplied to the amorphous magnetic wire is, for example, a pulse current or a high-frequency current. For example, when a pulse current or a high-frequency current is supplied to the amorphous magnetic wire, a magnetization change corresponding to the strength of the magnetic field acting on the amorphous magnetic wire is caused in the amorphous magnetic wire at the timing of the rise of the current. In the detection coil, an induced voltage due to a magnetization change in the amorphous magnetic wire is generated.

A detection circuit is connected to the detection coil in order to detect an induced voltage caused in the detection coil. Patent Literature 1 discloses a configuration including a detector circuit, an amplifier circuit, and a feedback circuit as detection circuits. The detector circuit includes a switch that performs an on operation corresponding to the timing of supply of the excitation current, and a hold capacitor for holding a voltage at the time of the on operation of the switch. The amplifier circuit includes an operational amplifier, and amplifies the voltage held in the hold capacitor. The feedback circuit is configured to connect an output terminal of the amplifier circuit and one end of the detection coil and magnetically apply negative feedback.

PRIOR ART LITERATURE

Patent Literature

Patent Literature 1: JP 5924503 B2

SUMMARY OF INVENTION

Problems to be Solved by Invention

The detection circuit constituting the magnetic detection device disclosed in Patent Literature 1 magnetically applies negative feedback by the feedback circuit. Therefore, in a state where a detection target magnetic field acts on the amorphous magnetic wire, a feedback current flows through the detection coil, and a feedback magnetic field that can cancel the detection target magnetic field can be generated. Therefore, when the detection target magnetic field is canceled by the feedback magnetic field, the magnetic field is brought into a state of not acting on the amorphous magnetic wire.

Here, the feedback magnetic field generated by the feedback current flowing through the detection coil depends on the magnitude of the feedback current. Therefore, when the detection target magnetic field is strong, it is necessary to increase the feedback current in order for the detection coil to generate the feedback magnetic field for canceling the detection target magnetic field.

In the detection circuit disclosed in Patent Literature 1, the feedback circuit is connected to one end of the detection coil, and the other end of the detection coil is grounded. Therefore, the feedback current flowing through the detection coil has a magnitude corresponding to the potential difference between the feedback voltage generated by the feedback circuit and the ground voltage.

As a means for increasing the feedback current in the detection circuit, a means for reducing a resistance in the circuit through which the feedback current flows is conceivable. However, when the resistance is reduced, noise in the feedback voltage increases. As the noise of the feedback voltage increases, the noise of the feedback current increases, and noise occurs in the feedback magnetic field generated in the detection coil. Therefore, in order to generate a desired feedback magnetic field in the detection coil, it is not appropriate to reduce the resistance in the circuit through which the feedback current flows. As another means for increasing the feedback current, a means for increasing the power supply voltage in the feedback circuit is conceivable. However, when the power supply voltage is increased, the detection circuit is increased in size.

The present invention has been made in view of such background, and an object of the present invention is to provide a magnetic detection device that can increase a feedback current flowing through a detection coil without reducing a resistance of a circuit through which the feedback current flows and without increasing a power supply voltage in a case where the magnetic detection device includes a feedback circuit.

Means for Solving Problems

An aspect of the present invention is a magnetic detection device including:

a magnetoimpedance sensor element including a magnetic sensitive body that is configured to cause a magnetization change corresponding to a strength of a magnetic field when an excitation current is supplied, and a detection coil that is wound around the magnetic sensitive body and is configured to output an induced voltage caused by the magnetization change of the magnetic sensitive body;

a main operational amplifier having an inverting input terminal and a non-inverting input terminal, one of which is connected to a first end of the detection coil, and an other of which is connected to a second end of the detection coil opposite to the first end;

a first feedback circuit that is connected between an output terminal of the main operational amplifier and the first end of the detection coil and is configured to generate a first feedback voltage for causing a feedback current in the detection coil; and a second feedback circuit that is connected between the output terminal of the main operational amplifier and the second end of the detection coil and is configured to generate a second feedback voltage with a polarity that inverts a polarity of the first feedback voltage with respect to a predetermined reference voltage as a baseline for causing the feedback current in the detection coil.

Effects of Invention

The magnetic detection device according to the above aspect includes a main operational amplifier connected to a detection coil, and a feedback circuit that connects an output terminal of the main operational amplifier and the detection coil. With this configuration, in a state where a detection target magnetic field acts on the magnetic sensitive body, a feedback current is caused in the detection coil, and the detection coil generates a feedback magnetic field for canceling the detection target magnetic field. If the feedback magnetic field is brought into a state of completely canceling the detection target magnetic field, the feedback current is brought into a state corresponding to the strength of the detection target magnetic field. That is, if the feedback magnetic field can completely cancel the detection target magnetic field, the detection target magnetic field can be detected with high accuracy by detecting the feedback current or a physical quantity corresponding to the feedback current.

In a state where the feedback magnetic field cancels the detection target magnetic field, the magnetic field is brought into a state of not acting on the magnetic sensitive body. Therefore, the feedback current corresponding to the detection target magnetic field does not depend on the electromagnetic characteristics of the magnetic sensitive body. The relationship between the detection target magnetic field and the feedback current becomes a relationship having linearity. Therefore, by detecting the feedback current or a physical quantity corresponding to the feedback current, it is possible to improve the detection accuracy of the detection target magnetic field.

Furthermore, according to the magnetic detection device in the above aspect, both ends of the detection coil of the magnetoimpedance sensor element are connected to the inverting input terminal and the non-inverting input terminal of the main operational amplifier. Furthermore, the magnetic detection device includes two feedback circuits. One of the two feedback circuits is a first feedback circuit connected between an output terminal of the main operational amplifier and a first end of the detection coil. The other of the two feedback circuits is a second feedback circuit connected between the output terminal of the main operational amplifier and a second end of the detection coil.

With such configuration, the feedback current caused in the detection coil becomes a current corresponding to a potential difference between a first feedback voltage generated by the first feedback circuit and a second feedback voltage generated by the second feedback circuit. That is, the physical quantity corresponding to the feedback current described above can be, for example, a potential difference between the first feedback voltage and the second feedback voltage.

The polarity of the second feedback voltage inverts the polarity of the first feedback voltage with respect to a predetermined reference voltage as the baseline. Therefore, it is possible to increase the potential difference between the first feedback voltage and the second feedback voltage. That is, it is possible to increase the feedback current. In order to increase the feedback current, the resistance of the circuit through which the feedback current flows is not reduced, and the power supply voltage is not increased.

As described above, according to the above aspect, it is possible to provide a magnetic detection device that can increase a feedback current flowing through a detection coil without reducing a resistance of a circuit through which the feedback current flows and without increasing a power supply voltage in a case where the magnetic detection device includes a feedback circuit.

BRIEF DESCRIPTION OF DRAWINGS

FIG. 5 is a view for explaining operation of the magnetic detection device of the comparative example.

MODE FOR CARRYING OUT INVENTION

Figure 1:
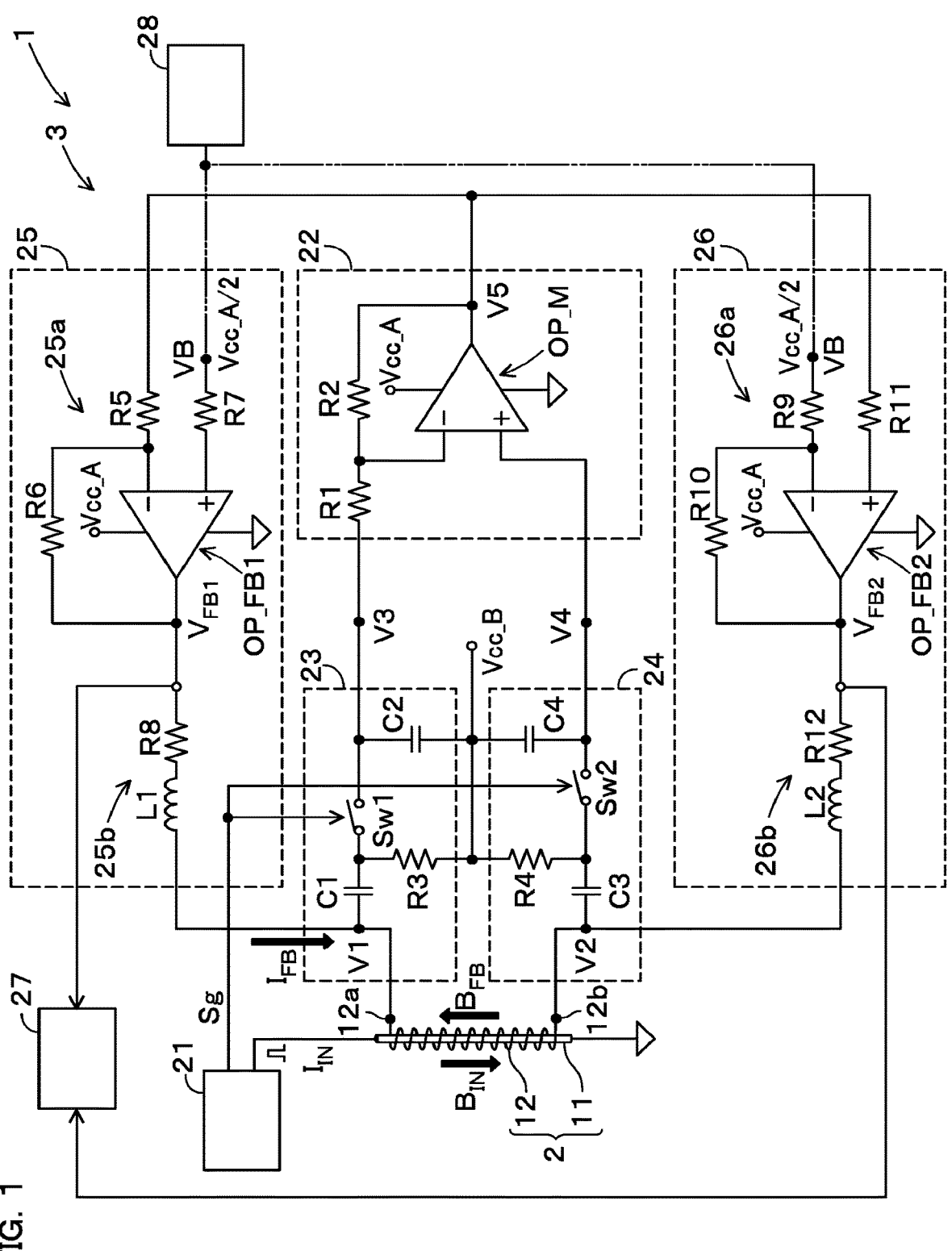
FIG. 1 is a view illustrating a configuration of a magnetic detection device of a first embodiment.

A magnetic detection device can be variously applied as long as it is intended to detect the strength of a magnetic field. For example, the magnetic detection device can be used for an electronic compass, a foreign object detection sensor, a magnetic positioning system, and the like.

In the magnetic detection device, a magnetic wire, in particular, an amorphous magnetic wire can be used as the magnetic sensitive body constituting the magnetoimpedance sensor element. Note that as the magnetic sensitive body, a magnetic sensitive body other than the amorphous magnetic wire can be applied as long as it has a property of causing a magnetization change corresponding to the strength of the magnetic field when an excitation current is supplied. As the excitation current supplied to the magnetic sensitive body, for example, a periodic current such as a pulse current or a high-frequency current can be applied.

In the magnetic detection device, the first feedback circuit can be configured to include a first feedback operational amplifier having an input terminal connected to an output terminal side of the main operational amplifier and an output terminal connected to the first end side of the detection coil, and the second feedback circuit can be configured to include a second feedback operational amplifier having an input terminal connected to the output terminal side of the main operational amplifier and an output terminal connected to the second end side of the detection coil.

In this case, the first feedback voltage is a voltage of the output terminal of the first feedback operational amplifier, the second feedback voltage is a voltage of the output terminal of the second feedback operational amplifier, and in the input terminal connected to the output terminal side of the main operational amplifier in the first feedback operational amplifier and the input terminal connected to the output terminal side of the main operational amplifier in the second feedback operational amplifier, one input terminal is the inverting input terminal, and the other input terminal is the non-inverting input terminal.

With this configuration, the first feedback voltage and the second feedback voltage can be voltages inverted with respect to the predetermined reference voltage. Therefore, it is possible to increase the potential difference between the first feedback voltage and the second feedback voltage, and it is possible to increase the feedback current.

When an amplification factor of the first feedback circuit and an amplification factor of the second feedback circuit are set to be identical, the second feedback voltage can be an inversion of the first feedback voltage with respect to the predetermined reference voltage as the baseline. Note that the amplification factor of the first feedback circuit and the amplification factor of the second feedback circuit can be set to different values.

In the magnetic detection device, the first feedback circuit can be configured to include the first feedback operational amplifier, and a first impedance circuit that is connected between the output terminal of the first feedback operational amplifier and the first end of the detection coil and is configured to suppress movement of the induced voltage output by the detection coil to the first feedback operational amplifier side. Furthermore, the second feedback circuit can be configured to include the second feedback operational amplifier, and a second impedance circuit that is connected between the output terminal of the second feedback operational amplifier and the second end of the detection coil and suppresses movement of the induced voltage output by the detection coil to the second feedback operational amplifier side.

The above configuration can suppress movement of the induced voltage to the first feedback operational amplifier side and can suppress movement of the induced voltage to the second feedback operational amplifier when the induced voltage is generated in the detection coil due to a magnetization change of the magnetic sensitive body. As a result, the feedback current can be a current having a magnitude that can generate a feedback magnetic field for canceling the detection target magnetic field.

An impedance of the first impedance circuit and an impedance of the second impedance circuit can be set to be identical. With this configuration, the first feedback voltage and the second feedback voltage can be desired inverted voltages. Note that the impedance of the first impedance circuit and the impedance of the second impedance circuit can be set to different values.

Furthermore, the magnetic detection device can also include a common feedback input voltage generation circuit that is connected to the output terminal of the main operational amplifier, is configured to perform at least one processing of phase adjustment processing, differentiation processing, and integration processing on an output voltage of the main operational amplifier, and is configured to generate a common feedback input voltage with respect to the first feedback circuit and the second feedback circuit.

In a case where a voltage having been subjected to the above processing is generated as an input voltage with respect to the first feedback circuit and the second feedback circuit, the circuit configuration can be simplified by providing one common feedback input voltage generation circuit as compared with a case where separate feedback input voltage generation circuits are provided.

The magnetic detection device can further include: a first input circuit that is connected between the first end of the detection coil and the inverting input terminal of the main operational amplifier, is configured to hold a voltage of the first end at a predetermined timing, and is configured to input a held voltage of the first end to the inverting input terminal of the main operational amplifier; and a second input circuit that is connected between the second end of the detection coil and the non-inverting input terminal of the main operational amplifier, is configured to hold a voltage of the second end at an identical timing to the predetermined timing, and is configured to input a held voltage of the second end to the non-inverting input terminal of the main operational amplifier. Thus, by providing the first input circuit and the second input circuit, the first feedback voltage and the second feedback voltage can be desired inverted voltages.

The predetermined reference voltage can be a positive voltage. That is, the first feedback voltage and the second feedback voltage can be voltages inverted with respect to a predetermined reference voltage that is a positive voltage. Due to this, the detection circuit can be configured to be operable in a positive voltage range. In this case, a single power supply operational amplifier can be applied as the main operational amplifier. Note that the predetermined reference voltage can be a ground voltage. In this case, the detection circuit is preferably operable at a positive voltage and a negative voltage.

Furthermore, the magnetic detection device can include a common reference power supply that is configured to apply the positive voltage as the predetermined reference voltage to the first feedback circuit and the second feedback circuit. The first feedback circuit and the second feedback circuit can be made smaller circuits as compared with a case where the reference power supply with respect to the first feedback circuit and the reference power supply with respect to the second feedback circuit are separate power supplies.

The magnetic detection device can include a signal output unit that is configured to output a potential difference between the first feedback voltage and the second feedback voltage or the feedback current as a detection signal indicating a strength of a detection target magnetic field acting on the magnetic sensitive body. As described above, the feedback current has a magnitude corresponding to the strength of the detection target magnetic field. Therefore, by outputting the feedback current as a detection signal, the detection target magnetic field can be reliably detected. The potential difference between the first feedback voltage and the second feedback voltage is a physical quantity corresponding to the feedback current. Therefore, the signal output unit constituting the magnetic detection device can also output the potential difference between the first feedback voltage and the second feedback voltage as a detection signal.

First Embodiment

1. Configuration of Magnetic Detection Device 1

A magnetic detection device 1 in the first embodiment will be described with reference to FIG. 1. As illustrated in FIG. 1, the magnetic detection device 1 of the present embodiment includes a magnetoimpedance sensor element 2 (hereinafter, called an "MI sensor element"), and a detection circuit 3.

The MI sensor element 2 is configured to output a voltage corresponding to the strength of a magnetic field $B_{ACT}$ acting on the MI sensor element 2. The MI sensor element 2 includes a magnetic sensitive body 11 and a detection coil 12. When an excitation current is supplied, the magnetic sensitive body 11 causes a magnetization change corresponding to the strength of the magnetic field $B_{ACT}$ acting on the magnetic sensitive body 11. Specifically, when a pulse current or a high-frequency current is supplied as an excitation current, the magnetic sensitive body 11 changes in permeability in the circumferential direction corresponding to the strength of the magnetic field $B_{ACT}$ that acts, whereby the impedance changes. That is, when an excitation current is supplied to the magnetic sensitive body 11 in a state where the magnetic field $B_{ACT}$ acts on the magnetic sensitive body 11, the magnetic sensitive body 11 causes a magnetization change. For example, a magnetic wire, in particular, an amorphous magnetic wire is applied as the magnetic sensitive body 11. Hereinafter, the magnetic field $B_{ACT}$ acting on the magnetic sensitive body 11 is also appropriately called an "acting magnetic field".

Here, the acting magnetic field $B_{ACT}$ acting on the magnetic sensitive body 11 is a combined magnetic field of a detection target magnetic field $B_{IN}$, which is an external magnetic field acting on the magnetic sensitive body 11, and a feedback magnetic field $B_{FB}$ described later. Therefore, when the feedback magnetic field $B_{FB}$ completely cancels the detection target magnetic field $B_{IN}$, the magnetic field does not act on the magnetic sensitive body 11. That is, even if the detection target magnetic field $B_{IN}$ acts on the magnetic sensitive body 11, the acting magnetic field $B_{ACT}$ in the magnetic sensitive body 11 becomes substantially zero by causing the feedback magnetic field $B_{FB}$.

The detection coil 12 is wound around the magnetic sensitive body 11. When the magnetic field $B_{ACT}$ acts on the magnetic sensitive body 11 and an excitation current is supplied, an induced voltage is caused in the detection coil 12 due to a magnetization change of the magnetic sensitive body 11. Therefore, the detection coil 12 outputs the induced voltage caused by the magnetization change of the magnetic sensitive body 11.

The detection circuit 3 is electrically connected to the MI sensor element 2, and is configured to detect the strength of the detection target magnetic field $B_{IN}$ acting on the magnetic sensitive body 11. The detection circuit 3 includes an excitation circuit 21, a main amplifier circuit 22, a first input circuit 23, a second input circuit 24, a first feedback circuit 25, a second feedback circuit 26, a signal output unit 27, and a reference power supply 28.

The excitation circuit 21 supplies the magnetic sensitive body 11 with a pulse current or a high-frequency current as an excitation current $I_{IN}$. Furthermore, the excitation circuit 21 outputs a switch timing signal Sg for holding the induced voltage of the detection coil 12.

The main amplifier circuit 22 amplifies a potential difference between a first end 12a and a second end 12b of the detection coil 12. The second end 12b of the detection coil 12 is an end opposite to the first end 12a. The main amplifier circuit 22 includes a main operational amplifier OP_M. In the present embodiment, the main amplifier circuit 22 includes resistances R1 and R2 for defining an amplification factor. However, as the main amplifier circuit 22, various amplifier forms can be adopted as long as they have a configuration that can amplify a signal with a predetermined amplification factor.

The main operational amplifier OP_M has an inverting input terminal and a non-inverting input terminal, one of the inverting input terminal and the non-inverting input terminal of the main operational amplifier OP_M is connected to the first end 12a of the detection coil 12, and the other of the inverting input terminal and the non-inverting input terminal is connected to the second end 12b of the detection coil 12. In the present embodiment, the inverting input terminal of the main operational amplifier OP_M is connected to the first end 12a of the detection coil 12, and the non-inverting input terminal is connected to the second end 12b of the detection coil 12. The main operational amplifier OP_M is configured by a single power supply operational amplifier. Therefore, a reference power supply 28 is connected to a positive power supply terminal of the main operational amplifier OP_M, and a maximum voltage Vcc_A of the reference power supply 28 is applied thereto. A negative power supply terminal of the main operational amplifier OP_M is grounded.

The first input circuit 23 is connected between the first end 12a of the detection coil 12 and one of the inverting input terminal and the non-inverting input terminal of the main operational amplifier OP_M. The first input circuit 23 holds the voltage of the first end 12a at a predetermined timing, and inputs the held voltage of the first end 12a to the one of the inverting input terminal and the non-inverting input terminal of the main operational amplifier OP_M. In the present embodiment, the first input circuit 23 is connected between the first end 12a of the detection coil 12 and the inverting input terminal of the main operational amplifier OP_M.

The first input circuit 23 includes a capacitor C1 and a resistance R3 constituting a high-pass filter, a switch Sw1 that performs an on operation at a predetermined timing, and a hold capacitor C2. The first input circuit 23 outputs a voltage having a frequency larger than a cutoff frequency at the first end 12a of the detection coil 12 by the high-pass filter. The resistance R3 constituting the high-pass filter can be replaced with a component having a predetermined impedance such as an inductor. The switch Sw1 performs the on operation at the timing when the switch timing signal Sg is output by the above-described excitation circuit 21.

The hold capacitor C2 holds the voltage when the switch Sw1 performs the on operation. Here, one end of the hold capacitor C2 is connected to the switch Sw1, and the other end of the hold capacitor C2 is connected to a predetermined reference potential Vcc_B.

The second input circuit 24 is connected between the second end 12b of the detection coil 12 and the other of the inverting input terminal and the non-inverting input terminal of the main operational amplifier OP_M. The second input circuit 24 holds the voltage of the second end 12b at a predetermined timing, and inputs the held voltage of the second end 12b to the other of the inverting input terminal and the non-inverting input terminal of the main operational amplifier OP_M. In the present embodiment, the second input circuit 24 is connected between the second end 12b of the detection coil 12 and the non-inverting input terminal of the main operational amplifier OP_M. The predetermined timing at which the second input circuit 24 holds is the identical timing to the predetermined timing at which the first input circuit 23 holds.

The second input circuit 24 is disposed symmetrically with the first input circuit 23, and constitutes a circuit similar to the first input circuit 23. The second input circuit 24 includes a capacitor C3 and a resistance R4 constituting a high-pass filter, a switch Sw2 that performs an on operation at a predetermined timing, and a hold capacitor C4. The second input circuit 24 outputs a voltage having a frequency higher than a cutoff frequency at the second end 12b of the detection coil 12 by the high-pass filter. The resistance R4 constituting the high-pass filter can be replaced with a component having a predetermined impedance such as an inductor. The switch Sw2 performs the on operation at the timing when the switch timing signal Sg is output by the above-described excitation circuit 21.

The hold capacitor C4 holds the voltage when the switch Sw2 performs the on operation. Here, one end of the hold capacitor C4 is connected to the switch Sw2, and the other end of the hold capacitor C4 is connected to the predetermined reference potential Vcc_B.

The first feedback circuit 25 is connected between an output terminal of the main operational amplifier OP_M and the first end 12a of the detection coil 12. The first feedback circuit 25 generates a first feedback voltage $V_{FB1}$ for generating a feedback current $I_{FB}$ in the detection coil 12.

The first feedback circuit 25 includes a circuit 25a configured by a first feedback operational amplifier OP_FB1 and a first impedance circuit 25b. The circuit 25a configured by the first feedback operational amplifier OP_FB1 may be an amplifier circuit or may be a buffer circuit. In the present embodiment, the circuit 25a exemplifies an inverting amplifier circuit.

The first feedback operational amplifier OP_FB1 is configured by a single power supply operational amplifier. The reference power supply 28 is connected to a positive power supply terminal of the first feedback operational amplifier OP_FB1, and the maximum voltage Vcc_A of the reference power supply 28 is applied. A negative power supply terminal of the first feedback operational amplifier OP_FB1 is grounded.

An input terminal of the first feedback operational amplifier OP_FB1 is connected to the output terminal side of the main operational amplifier OP_M. In the present embodiment, an inverting input terminal of the first feedback operational amplifier OP_FB1 is connected to the output terminal side of the main operational amplifier OP_M via a resistance R5. In the first feedback operational amplifier OP_FB1, the voltage of the inverting input terminal operates to match the voltage of a non-inverting input terminal.

The non-inverting input terminal of the first feedback operational amplifier OP_FB1 is connected to the reference power supply 28 via a resistance R7. For example, a voltage "Vcc_A/2" in which the maximum voltage Vcc_A of the reference power supply 28 is halved is applied to an end opposite to the first feedback operational amplifier OP_FB1 at the resistance R7. The voltage "Vcc_A/2" is a predetermined reference voltage VB. In the present embodiment, the predetermined reference voltage VB is set to a positive voltage.

An output terminal of the first feedback operational amplifier OP_FB1 is connected to the first end 12a side of the detection coil 12. The first feedback voltage $V_{FB1}$ is a voltage of the output terminal of the first feedback operational amplifier OP_FB1. Since the circuit 25a constituting the first feedback operational amplifier OP_FB1 is an inverting amplifier circuit, the amplification factor is determined by the ratio of the resistances R5 and R6.

The first impedance circuit 25b is connected between the output terminal of the first feedback operational amplifier OP_FB1 and the first end 12a of the detection coil 12. The first impedance circuit 25b is configured to suppress movement of the induced voltage output from the detection coil 12 to the first feedback operational amplifier OP_FB1 side. In the present embodiment, the first impedance circuit 25b is configured by a resistance R8 and an inductor L1. However, as the first impedance circuit 25b, various impedance circuits can be applied.

The second feedback circuit 26 is connected between the output terminal of the main operational amplifier OP_M and the second end 12b of the detection coil 12. The second feedback circuit 26 generates a second feedback voltage $V_{FB2}$ for generating the feedback current $I_{FB}$ in the detection coil 12.

The second feedback circuit 26 includes a circuit 26a configured by a second feedback operational amplifier OP_FB2 and a second impedance circuit 26b. The circuit 26a configured by the second feedback operational amplifier OP_FB2 may be an amplifier circuit or may be a buffer circuit. However, the circuit 26a constitutes a circuit inverted from the circuit 25a constituting the first feedback circuit 25. In the present embodiment, the circuit 26a exemplifies a non-inverting amplifier circuit.

The second feedback operational amplifier OP_FB2 is configured by a single power supply operational amplifier. The reference power supply 28 is connected to a positive power supply terminal of the second feedback operational amplifier OP_FB2, and the maximum voltage Vcc_A of the reference power supply 28 is applied thereto. A negative power supply terminal of the second feedback operational amplifier OP_FB2 is grounded.

An input terminal of the second feedback operational amplifier OP_FB2 is connected to the output terminal side of the main operational amplifier OP_M. In the present embodiment, an inverting input terminal of the second feedback operational amplifier OP_FB2 is connected to the reference power supply 28 via a resistance R9. The voltage "Vcc_A/2" in which the maximum voltage Vcc_A of the reference power supply 28 is halved is applied to an end opposite to the second feedback operational amplifier OP_FB2 at the resistance R9. The voltage "Vcc_A/2" is the predetermined reference voltage VB. The resistance R9 is the identical resistance to the resistance R7 in the first feedback circuit 25. Then, in the second feedback operational amplifier OP_FB2, the voltage of the inverting input terminal operates to match the voltage of the non-inverting input terminal.

A non-inverting input terminal of the second feedback operational amplifier OP_FB2 is connected to the output terminal side of the main operational amplifier OP_M via a resistance R11. In the present embodiment, the resistance R11 is the identical resistance to the resistance R5 in the first feedback circuit 25.

An output terminal of the second feedback operational amplifier OP_FB2 is connected to the second end 12b side of the detection coil 12. The second feedback voltage $V_{FB2}$ is a voltage of the output terminal of the second feedback operational amplifier OP_FB2. Since the circuit 26a constituting the second feedback operational amplifier OP_FB2 is a non-inverting amplifier circuit, the amplification factor is determined by the ratio of the resistances R9 and R10.

By configuring the first feedback circuit 25 and the second feedback circuit 26 as described above, the polarity of the second feedback voltage $V_{FB2}$ inverts the polarity of the first feedback voltage $V_{FB1}$ with respect to the predetermined reference voltage VB as the baseline. The polarity here means whether it is positive or negative when the predetermined reference voltage VB is set to zero potential.

In the present embodiment, the amplification factor of the circuit 26a constituting the non-inverting amplifier circuit in the second feedback circuit 26 is set to be identical to the amplification factor of the circuit 25a constituting the inverting amplifier circuit in the first feedback circuit 25. Therefore, the second feedback voltage $V_{FB2}$ can be an inverted voltage of the first feedback voltage $V_{FB1}$ with respect to the predetermined reference voltage VB as the baseline. In this case, the ratio of an absolute value of the difference between the first feedback voltage $V_{FB1}$ and the predetermined reference voltage VB to an absolute value of the difference between the second feedback voltage $V_{FB2}$ and the predetermined reference voltage VB becomes 1.

However, the amplification factor of the circuit 25a and the amplification factor of the circuit 26a can be set to different values. In this case, the ratio of the absolute value of the difference between the first feedback voltage $V_{FB1}$ and the predetermined reference voltage VB to the absolute value of the difference between the second feedback voltage $V_{FB2}$ and the predetermined reference voltage VB becomes a value other than 1.

The second impedance circuit 26b is connected between the output terminal of the second feedback operational amplifier OP_FB2 and the second end 12b of the detection coil 12. The second impedance circuit 26b is configured to suppress movement of the induced voltage output from the detection coil 12 to the second feedback operational amplifier OP_FB2 side. In the present embodiment, the second impedance circuit 26b is configured by a resistance R12 and an inductor L2. However, as the second impedance circuit 26b, various impedance circuits can be applied. The impedance of the second impedance circuit 26b is set to be identical to the impedance of the first impedance circuit 25b.

The signal output unit 27 outputs a potential difference $\Delta Vx$ between the first feedback voltage $V_{FB1}$ and the second feedback voltage $V_{FB2}$ or the feedback current $I_{FB}$ as a detection signal indicating the strength of the detection target magnetic field $B_{IN}$ acting on the magnetic sensitive body 11.

In the present embodiment, a potential difference between the first feedback voltage $V_{FB1}$ and the predetermined reference voltage VB is a value half the potential difference $\Delta Vx$ between the first feedback voltage $V_{FB1}$ and the second feedback voltage $V_{FB2}$. A potential difference between the second feedback voltage $V_{FB2}$ and the predetermined reference voltage VB is the value half potential difference $\Delta Vx$. Therefore, the potential difference between the first feedback voltage $V_{FB1}$ and the predetermined reference voltage VB and the potential difference between the second feedback voltage $V_{FB2}$ and the predetermined reference voltage VB also correspond to the detection target magnetic field $B_{IN}$. Therefore, the signal output unit 27 can also output the potential difference between the first feedback voltage $V_{FB1}$ and the predetermined reference voltage VB or the potential difference between the second feedback voltage $V_{FB2}$ and the predetermined reference voltage VB as a detection signal indicating the strength of the detection target magnetic field $B_{IN}$ acting on the magnetic sensitive body 11.

The reference power supply 28 applies a power supply voltage to the positive power supply terminals of the main operational amplifier OP_M, the first feedback operational amplifier OP_FB1, and the second feedback operational amplifier OP_FB2. Furthermore, the reference power supply 28 also functions as a common power supply that applies a positive voltage as the predetermined reference voltage VB to the first feedback operational amplifier OP_FB1 and the second feedback operational amplifier OP_FB2.

2. Operation of MI Sensor Element 2

Figure 2:
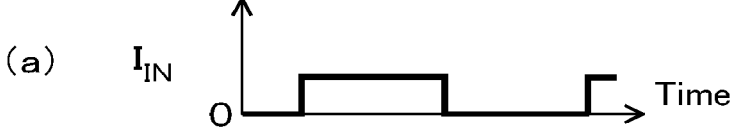
FIG. 2 is a view illustrating operation of a magnetoimpedance sensor element constituting the magnetic detection device of the first embodiment.
Figure 2:
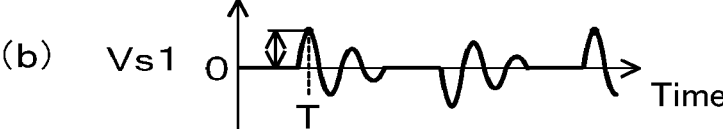
Figure 2:
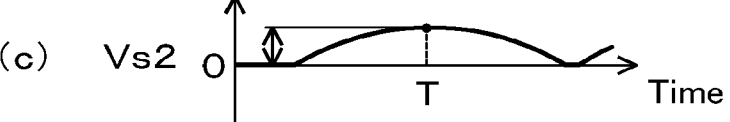

Next, the operation of the MI sensor element 2 will be described with reference to FIG. 2. Here, assuming a case where the MI sensor element 2 is not connected to the detection circuit 3 illustrated in FIG. 1. That is, the operation of the MI sensor element 2 alone will be described.

FIG. 2(a) illustrates a case where the excitation current $I_{IN}$ supplied to the magnetic sensitive body 11 is a pulse current. The MI sensor element 2 can be designed such that the response speed of the induced voltage differs with respect to a change in the rise of the pulse current. FIG. 2(b) illustrates an induced voltage Vs1 in a case where the MI sensor element 2 has a high response when the magnetic field acts on the MI sensor element 2. FIG. 2(c) illustrates an induced voltage Vs2 in a case where the MI sensor element 2 has a low response when the magnetic field acts on the MI sensor element 2.

As illustrated in FIG. 2(a), when the excitation current $I_{IN}$, which is a pulse current, is supplied to the magnetic sensitive body 11, the magnetic sensitive body 11 has a magnetization change corresponding to the strength of the magnetic field acting on the magnetic sensitive body 11 due to the change in the rise of the pulse current. As illustrated in FIG. 2(b) or 2(c), an induced voltage is caused in the detection coil 12 due to the magnetization change of the magnetic sensitive body 11.

As illustrated in FIG. 2(b), when the MI sensor element 2 has a high response, the induced voltage Vs1 exhibits damped oscillation immediately after the rise of the pulse current. Then, at time T, the induced voltage Vs1 becomes a peak value. The peak value of the induced voltage Vs1 corresponds to the strength of the magnetic field acting on the MI sensor element 2. Note that when the MI sensor element 2 has a high response, the induced voltage Vs1 exhibits damped oscillation even immediately after a fall of the pulse current.

As illustrated in FIG. 2(c), when the MI sensor element 2 has a low response, the induced voltage Vs2 gradually increases right from the rise of the pulse current. Then, at time T, the induced voltage Vs2 becomes a peak value. The peak value of the induced voltage Vs2 corresponds to the strength of the magnetic field acting on the MI sensor element 2. Then, the induced voltage Vs2 gradually decreases right from the fall of the pulse current.

In the magnetic detection device 1 of the present embodiment, as the MI sensor element 2 a high-response configuration can be applied or a low-response configuration can be applied.

3. Operation of Magnetic Detection Device 1

Figure 3:
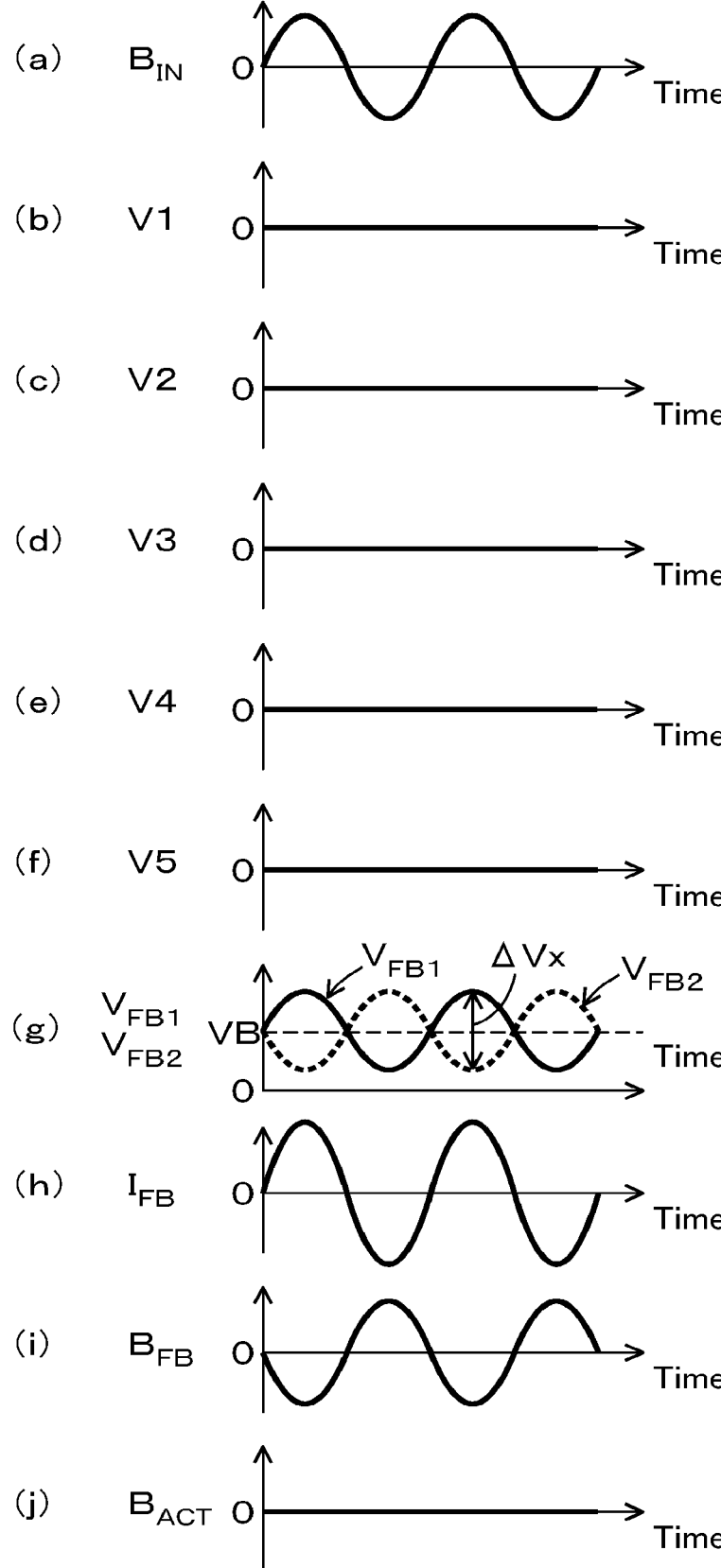
FIG. 3 is a view for explaining operation of the magnetic detection device of the first embodiment.

Next, the operation of the magnetic detection device 1 will be described with reference to FIG. 3. FIG. 3 describes the behavior of voltages V1 to V5, the first feedback voltage $V_{FB1}$, the second feedback voltage $V_{FB2}$, the feedback current $I_{FB}$, the feedback magnetic field $B_{FB}$, and the acting magnetic field $B_{ACT}$ of each portion in the detection circuit 3 when the detection target magnetic field $B_{IN}$ acts on the magnetic sensitive body 11.

As illustrated in FIG. 3(a), regarding the detection target magnetic field $B_{IN}$ acting on the magnetic sensitive body 11, a case where the magnetic field direction periodically changes is assumed, and a case where the strength of the magnetic field changes as a sine wave is taken as an example. However, the behavior of the detection target magnetic field $B_{IN}$ for easy understanding of description is taken as an example, and arbitrary behavior is exhibited in reality.

In a case where the detection circuit 3 does not include the first feedback circuit 25 and the second feedback circuit 26, as described with reference to FIG. 2, the potential difference between the both ends of the detection coil 12 varies according to the strength of the detection target magnetic field $B_{IN}$ acting on the magnetic sensitive body 11. However, in the present embodiment, the detection circuit 3 includes the first feedback circuit 25 and the second feedback circuit 26 as described above. Therefore, the feedback current $I_{FB}$ is generated such that the potential difference between the both ends of the detection coil 12 becomes zero.

In the present embodiment, when the feedback current $I_{FB}$ is generated and the feedback current $I_{FB}$ flows through the detection coil 12 as illustrated in FIG. 3(*h*), the feedback magnetic field $B_{FB}$ is generated in the detection coil 12 as illustrated in FIG. 3(*i*). If the feedback magnetic field $B_{FB}$ can completely cancel the detection target magnetic field $B_{IN}$, the acting magnetic field $B_{ACT}$ acting on the magnetic sensitive body 11 becomes zero as illustrated in FIG. 3(*j*).

That is, even if the detection target magnetic field $B_{IN}$ acts on the magnetic sensitive body 11, the acting magnetic field $B_{ACT}$ acting on the magnetic sensitive body 11 becomes substantially zero. Therefore, even if the excitation current $I_{IN}$ is supplied to the magnetic sensitive body 11, since the acting magnetic field $B_{ACT}$ is substantially zero, the induced voltage of the detection coil 12 becomes substantially zero. As illustrated in FIGS. 3(*b*) and 3(*c*), the voltages V1 and V2 at the both ends of the detection coil 12 become substantially zero.

Since the voltages V1 and V2 at the both ends of the detection coil 12 become substantially zero, as illustrated in FIGS. 3(*d*) and 3(*e*), the voltages V3 and V4 at an inverting input terminal and a non-inverting input terminal of the main amplifier circuit 22 also become substantially zero. Therefore, as illustrated in FIG. 3(*f*), the voltage V5 of an output terminal of the main amplifier circuit 22 also becomes substantially zero.

As described above, the detection circuit 3 includes the first feedback circuit 25 and the second feedback circuit 26, whereby the feedback current $I_{FB}$ is generated. The feedback current $I_{FB}$ is determined by the potential difference $\Delta Vx$ between the first feedback voltage $V_{FB1}$ and the second feedback voltage $V_{FB2}$ and the impedance in the circuit where the feedback current $I_{FB}$ flows through the detection coil 12. In the present embodiment, the impedance in the circuit where the feedback current flows through the detection coil 12 becomes a combination of the impedance of the first impedance circuit 25*b* and the impedance of the second impedance circuit 26*b*.

Then, the polarity of the second feedback voltage $V_{FB2}$ inverts the polarity of the first feedback voltage $V_{FB1}$ with respect to the predetermined reference voltage VB as the baseline. In the present embodiment, the second feedback voltage $V_{FB2}$ becomes an inversion of the first feedback voltage $V_{FB1}$ with respect to the predetermined reference voltage VB.

Therefore, the first feedback voltage $V_{FB1}$ and the second feedback voltage $V_{FB2}$ exhibit the behavior as illustrated in FIG. 3(*g*). The potential difference $\Delta Vx$ between the first feedback voltage $V_{FB1}$ and the second feedback voltage $V_{FB2}$ becomes a value larger than the potential difference between the first feedback voltage $V_{FB1}$ and the predetermined reference voltage VB. In the present embodiment, the potential difference $\Delta Vx$ between the first feedback voltage $V_{FB1}$ and the second feedback voltage $V_{FB2}$ becomes a value twice the potential difference between the first feedback voltage $V_{FB1}$ and the predetermined reference voltage VB, and becomes a value twice the potential difference between the second feedback voltage $V_{FB2}$ and the predetermined reference voltage VB.

Thus, by increasing the potential difference $\Delta Vx$ between the first feedback voltage $V_{FB1}$ and the second feedback voltage $V_{FB2}$, it becomes possible to generate a large feedback current $I_{FB}$. Being able to generate the large feedback current $I_{FB}$ means being able to increase the feedback magnetic field $B_{FB}$. That is, since the feedback magnetic field $B_{FB}$ for canceling the large detection target magnetic field $B_{IN}$ can be generated, the large detection target magnetic field $B_{IN}$ can be detected.

4. Magnetic Detection Device 100 of Comparative Example

Figure 4:
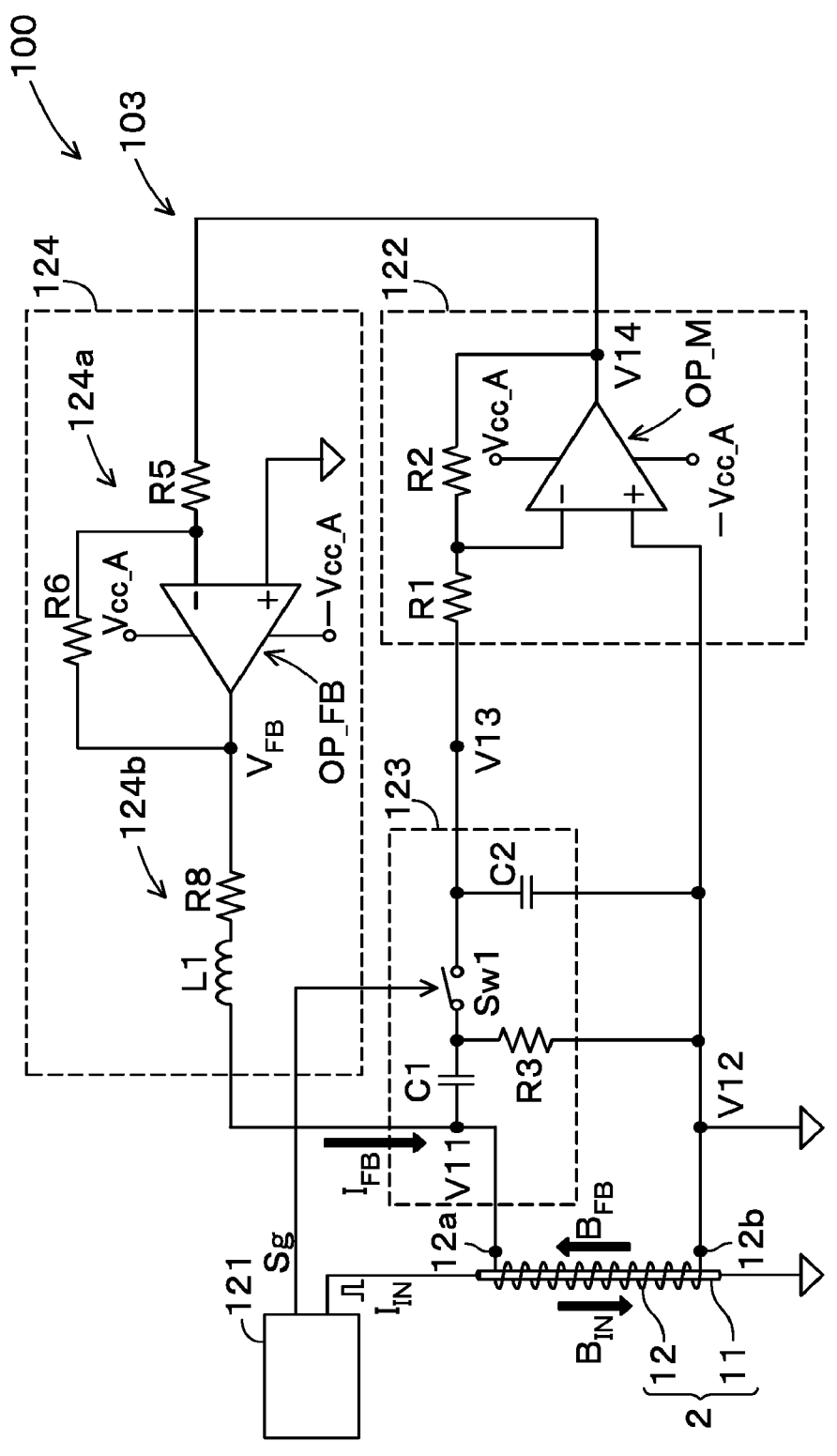
FIG. 4 is a view illustrating a configuration of a magnetic detection device of a comparative example.

The configuration of a magnetic detection device 100 of a comparative example will be described with reference to FIG. 4. The magnetic detection device 100 includes the MI sensor element 2 and a detection circuit 103. The MI sensor element 2 is identical to the MI sensor element 2 in the first embodiment described above.

The detection circuit 103 includes an excitation circuit 121, a main amplifier circuit 122, an input circuit 123, and a feedback circuit 124. In each configuration of the detection circuit 103, identical configurations to those of the first embodiment are denoted by identical signs.

The excitation circuit 121 supplies the excitation current $I_{IN}$ to the magnetic sensitive body 11, and outputs the switch timing signal Sg for holding the induced voltage of the detection coil 12 to the switch Sw1 of the input circuit 123. The main amplifier circuit 122 is configured by the main operational amplifier OP_M. In the comparative example, the main operational amplifier OP_M is configured by a dual power supply operational amplifier. The input circuit 123 has a configuration similar to that of the first input circuit 23 of the first embodiment. The feedback circuit 124 has a configuration substantially similar to that of the first feedback circuit 25 of the first embodiment. The feedback circuit 124 includes a circuit 124*a* configured by a feedback operational amplifier OP_FB and an impedance circuit 124*b*. The feedback operational amplifier OP_FB is configured by a dual power supply operational amplifier.

Figure 5:
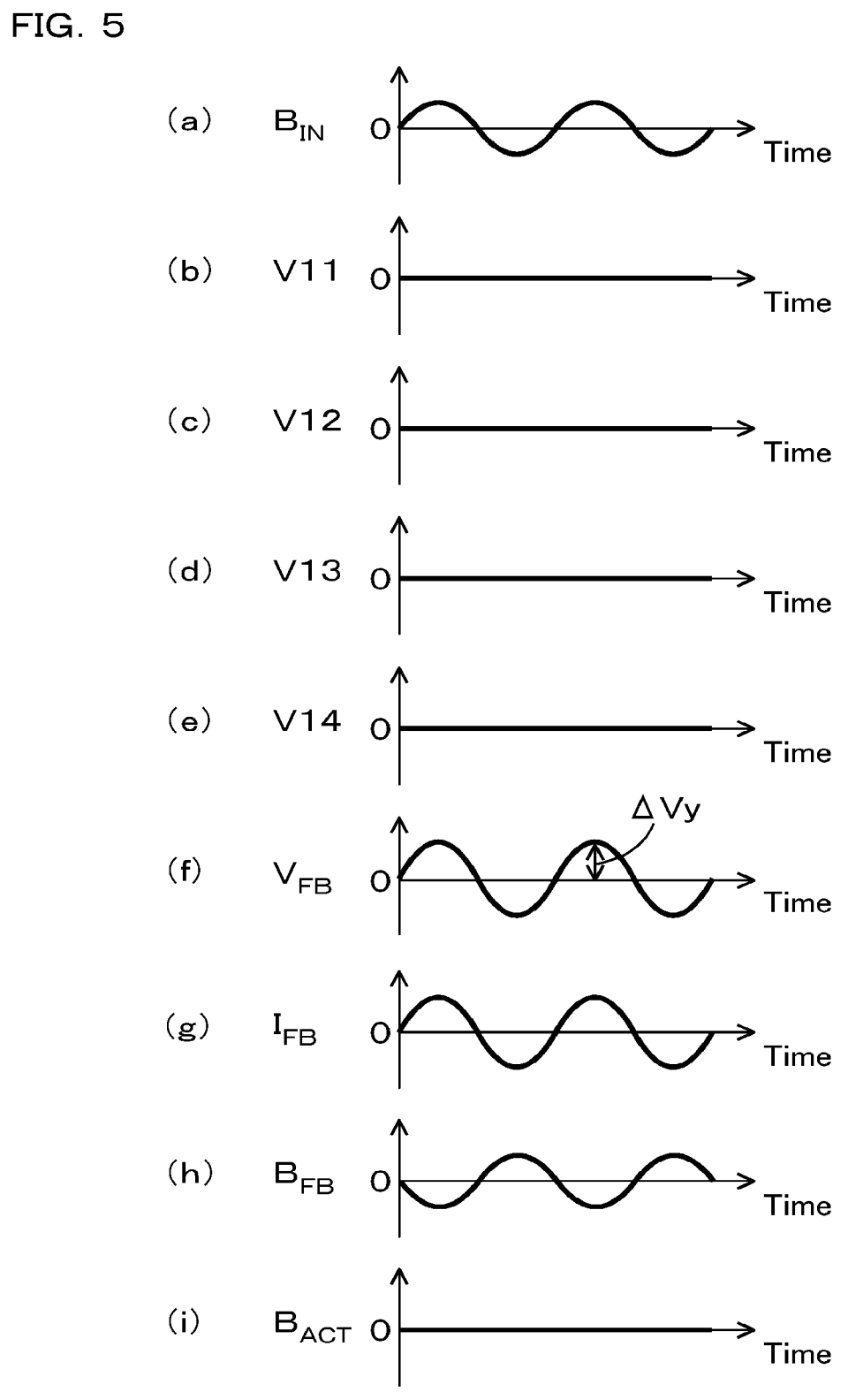

The operation of the magnetic detection device 100 of the comparative example will be described with reference to FIG. 5. As illustrated in FIG. 5(*a*), regarding the detection target magnetic field $B_{IN}$ acting on the magnetic sensitive body 11, a case where the magnetic field direction periodically changes is assumed, and a case where the strength of the magnetic field changes as a sine wave is taken as an example.

In this case, since the detection circuit 103 includes the feedback circuit 124, as illustrated in FIGS. 5(*b*) and 5(*c*), voltages V11 and V12 at the both ends of the detection coil 12 become substantially zero. Since the voltages V11 and V12 at the both ends of the detection coil 12 become substantially zero, a voltage V13 at an input terminal of the main amplifier circuit 122 also becomes substantially zero as illustrated in FIG. 5(*d*). Therefore, as illustrated in FIG. 5(*e*), a voltage V14 at an output terminal of the main amplifier circuit 122 also becomes substantially zero.

Then, the detection circuit 103 includes the feedback circuit 124, thereby generating the feedback current $I_{FB}$. The feedback current $I_{FB}$ is determined by a potential difference $\Delta Vy$ between the feedback voltage VFR and the ground voltage as a predetermined reference voltage and the impedance in the circuit where the feedback current $I_{FB}$ flows through the detection coil 12. In the comparative example, the impedance in the circuit where the feedback current flows through the detection coil 12 becomes the impedance of the impedance circuit 124*b*.

Therefore, the feedback voltage $V_{FB}$ exhibits the behavior as illustrated in FIG. 5(*f*). The feedback current $I_{FB}$ corresponding to the potential difference $\Delta Vy$ between the feedback voltage $V_{FB}$ and the ground voltage is generated in the detection coil 12, and the feedback magnetic field $B_{FB}$ is generated. When the detection target magnetic field $B_{IN}$ is brought into a state of being canceled by the feedback magnetic field $B_{FB}$, the acting magnetic field $B_{ACT}$ acting on the magnetic sensitive body 11 becomes substantially zero.

5. Comparison Between First Embodiment and Comparative Example

Figure 6:
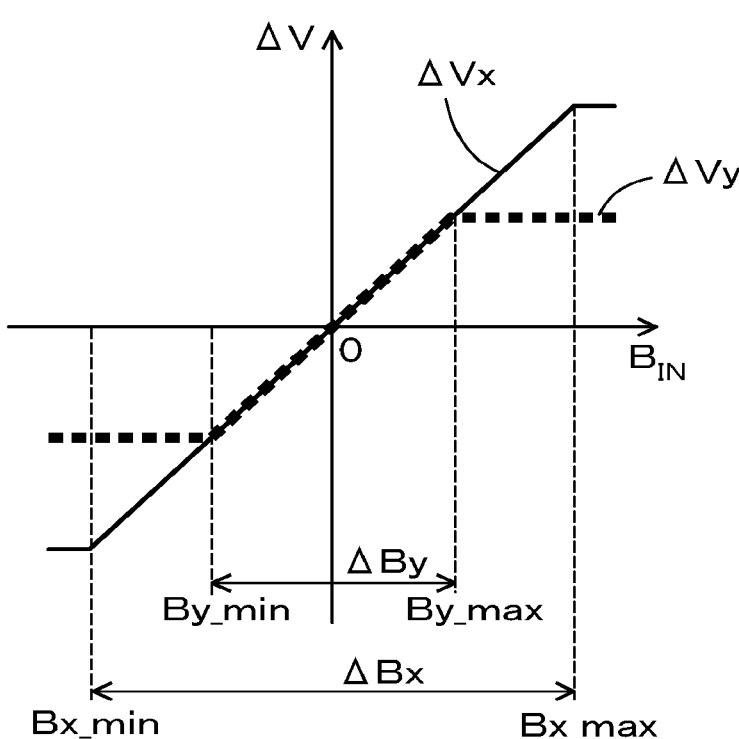
FIG. 6 is a view for explaining a range of a detection target magnetic field in the first embodiment and the comparative example.

With reference to FIG. 6, the magnetic detection device 1 of the first embodiment and the magnetic detection device 100 of the comparative example are compared. In FIG. 6, the solid line indicates the relationship between the detection target magnetic field $B_{IN}$ and the potential difference $\Delta Vx$ between the first feedback voltage $V_{FB1}$ and the second feedback voltage $V_{FB2}$ in the magnetic detection device 1 of the first embodiment. The potential difference $\Delta Vx$ between the first feedback voltage $V_{FB1}$ and the second feedback voltage $V_{FB2}$ corresponds to the feedback current $I_{FB}$. Therefore, in the first embodiment, the relationship between the detection target magnetic field $B_{IN}$ and the feedback current $I_{FB}$ also becomes a similar relationship.

In FIG. 6, the thick broken line indicates the relationship between the detection target magnetic field $B_{IN}$ and the potential difference $\Delta Vy$ between the feedback voltage $V_{FB}$ and the ground voltage in the magnetic detection device 100 of the comparative example. In the comparative example, since the second end 12b of the detection coil 12 is grounded, the potential difference $\Delta Vy$ between the feedback voltage VFR and the ground voltage corresponds to the feedback current $I_{FB}$. Therefore, in the comparative example, the relationship between the detection target magnetic field $B_{IN}$ and the feedback current $I_{FB}$ also becomes a similar relationship. Note that since the second end 12b of the detection coil 12 is grounded, the potential difference $\Delta Vy$ between the feedback voltage $V_{FB}$ and the ground voltage matches the feedback voltage $V_{FB}$.

In the first embodiment, in a range of $\Delta Bx$ where the detection target magnetic field $B_{IN}$ is centered at zero, the relationship between the detection target magnetic field $B_{IN}$ and the potential difference $\Delta Vx$ has linearity. That is, in the range of $\Delta Bx$, as the detection target magnetic field $B_{IN}$ increases, the potential difference $\Delta Vx$ increases, and the increase rate is constant.

However, when the strength of the magnetic field in one direction in the detection target magnetic field $B_{IN}$ becomes larger than Bx_max, the potential difference $\Delta Vx$ reaches a positive upper limit value, and therefore a larger feedback current $I_{FB}$ cannot be generated. Therefore, even if the strength of the magnetic field in one direction in the detection target magnetic field $B_{IN}$ becomes larger than Bx_max, the potential difference $\Delta Vx$ remains at a positive upper limit value. Note that when the first feedback voltage $V_{FB1}$ reaches the upper limit value, the potential difference $\Delta Vx$ reaches the positive upper limit value.

Similarly, when the strength of the magnetic field in the other direction in the detection target magnetic field $B_{IN}$ becomes larger than the absolute value of Bx_min, the potential difference $\Delta Vx$ reaches a negative lower limit value, and therefore the larger feedback current $I_{FB}$ cannot be generated. Therefore, even if the strength of the magnetic field in the other direction in the detection target magnetic field $B_{IN}$ becomes larger than the absolute value of Bx_min, the potential difference $\Delta Vx$ remains at the negative lower limit value. Note that when the second feedback voltage $V_{FB2}$ reaches the upper limit value, the potential difference $\Delta Vx$ reaches the negative lower limit value.

On the other hand, in the comparative example, in a range of $\Delta By$ where the detection target magnetic field $B_{IN}$ is centered at zero, the relationship between the detection target magnetic field $B_{IN}$ and the potential difference $\Delta Vy$ has linearity. That is, in the range of $\Delta By$, as the detection target magnetic field $B_{IN}$ increases, the potential difference $\Delta Vy$ increases, and the increase rate is constant.

However, when the strength of the magnetic field in one direction in the detection target magnetic field $B_{IN}$ becomes larger than By_max, the potential difference $\Delta Vy$ reaches a positive upper limit value, and therefore a larger feedback current $I_{FB}$ cannot be generated. Therefore, even if the strength of the magnetic field in one direction in the detection target magnetic field $B_{IN}$ becomes larger than By_max, the potential difference $\Delta Vy$ remains at a positive upper limit value. Note that when the feedback voltage $V_{FB}$ reaches the upper limit value, the potential difference $\Delta Vy$ reaches the positive upper limit value.

Similarly, when the strength of the magnetic field in the other direction in the detection target magnetic field $B_{IN}$ becomes larger than the absolute value of By_min, the potential difference $\Delta Vy$ reaches a negative lower limit value, and therefore the larger feedback current $I_{FB}$ cannot be generated. Therefore, even if the strength of the magnetic field in the other direction in the detection target magnetic field $B_{IN}$ becomes larger than the absolute value of By_min, the potential difference $\Delta Vy$ remains at the negative lower limit value. Note that when the feedback voltage $V_{FB}$ reaches the negative lower limit value, the potential difference $\Delta Vy$ reaches the negative lower limit value.

That is, in both the magnetic detection device 1 of the first embodiment and the magnetic detection device 100 of the comparative example, the detectable ranges $\Delta Bx$ and $\Delta By$ of the detection target magnetic field $B_{IN}$ depend on the maximum value of the feedback current $I_{FB}$.

In the magnetic detection device 1 of the first embodiment, the maximum value of the feedback current $I_{FB}$ depends on the magnitude of the potential difference $\Delta Vx$ (illustrated in FIG. 3(*g*)) between the first feedback voltage $V_{FB1}$ and the second feedback voltage $V_{FB2}$. The polarity of the second feedback voltage $V_{FB2}$ becomes an inverted polarity of the first feedback voltage $V_{FB1}$ with respect to the predetermined reference voltage VB as the baseline. In particular, the second feedback voltage $V_{FB2}$ becomes an inversion of the first feedback voltage $V_{FB1}$ with respect to the predetermined reference voltage VB. Therefore, the first feedback voltage $V_{FB1}$ and the second feedback voltage $V_{FB2}$ exhibit the behavior as illustrated in FIG. 3(*g*). The potential difference $\Delta Vx$ between the first feedback voltage $V_{FB1}$ and the second feedback voltage $V_{FB2}$ becomes a value twice the potential difference between the first feedback voltage $V_{FB1}$ and the predetermined reference voltage VB.

On the other hand, in the magnetic detection device 100 of the comparative example, the maximum value of the feedback current $I_{FB}$ depends on the magnitude of the potential difference $\Delta Vy$ (illustrated in FIG. 5(*f*)) between the feedback voltage $V_{FB}$ and the ground voltage.

The maximum values of the first feedback voltage $V_{FB1}$ and the second feedback voltage $V_{FB2}$ in the first embodiment and the maximum value of the feedback voltage $V_{FB}$ in the comparative example depend on the maximum voltage that can be applied by the power supply. The feedback current $I_{FB}$ depends on the impedance in the circuit where the feedback current $I_{FB}$ flows through the detection coil 12.

Therefore, in the first embodiment and the comparative example, when the maximum voltage which the power supply can apply is identical and the impedance in the circuit where the feedback current flows through the detection coil 12 is identical, the maximum value of the feedback current $I_{FB}$ of the first embodiment becomes twice the maximum value of the feedback current $I_{FB}$ of the comparative example. That is, the magnetic detection device 1 of the first embodiment can double the detectable range of the detection target magnetic field $B_{IN}$ even if the power supply voltage and the impedance are identical to those of the magnetic detection device 100 of the comparative example.

6. Effects of First Embodiment

The magnetic detection device 1 of the present embodiment includes the main operational amplifier OP_M connected to the detection coil 12, and the feedback circuits 25 and 26 that connect the output terminal of the main operational amplifier OP_M and the detection coil 12. With this configuration, in a state where the detection target magnetic field $B_{IN}$ acts on the magnetic sensitive body 11, the feedback current $I_{FB}$ is caused in the detection coil 12, and the detection coil 12 generates the feedback magnetic field $B_{FB}$ for canceling the detection target magnetic field $B_{IN}$. If the feedback magnetic field $B_{FB}$ is brought into a state of completely canceling the detection target magnetic field $B_{IN}$, the feedback current $I_{FB}$ or the feedback voltage $V_{FB}$ is brought into a state corresponding to the strength of the detection target magnetic field $B_{IN}$. That is, if the feedback magnetic field $B_{FB}$ can completely cancel the detection target magnetic field $B_{IN}$, the detection target magnetic field $B_{IN}$ can be detected with high accuracy by detecting the feedback current $I_{FB}$ or a physical quantity corresponding to the feedback current $I_{FB}$.

In a state where the feedback magnetic field $B_{FB}$ cancels the detection target magnetic field $B_{IN}$, the magnetic field is brought into a state of not acting on the magnetic sensitive body 11. Therefore, the feedback current $I_{FB}$ corresponding to the detection target magnetic field $B_{IN}$ does not depend on the electromagnetic characteristics of the magnetic sensitive body 11. The relationship between the detection target magnetic field $B_{IN}$ and the feedback current $I_{FB}$ becomes a relationship having linearity. Therefore, by detecting the feedback current $I_{FB}$ or a physical quantity corresponding to the feedback current $I_{FB}$, it is possible to improve the detection accuracy of the detection target magnetic field $B_{IN}$.

Furthermore, according to the magnetic detection device 1 of the present embodiment, the both ends of the detection coil 12 of the MI sensor element 2 are connected to the inverting input terminal and the non-inverting input terminal of the main operational amplifier OP_M. Furthermore, the magnetic detection device 1 includes the two feedback circuits 25 and 26. One of the two feedback circuits 25 and 26 is the first feedback circuit 25 connected between the output terminal of the main operational amplifier OP_M and the first end 12a of the detection coil 12. The other of the two feedback circuits 25 and 26 is the second feedback circuit 26 connected between the output terminal of the main operational amplifier OP_M and the second end 12b of the detection coil 12.

With such configuration, the feedback current $I_{FB}$ caused in the detection coil 12 becomes a current corresponding to the potential difference $\Delta Vx$ between the first feedback voltage $V_{FB1}$ generated by the first feedback circuit 25 and the second feedback voltage $V_{FB2}$ generated by the second feedback circuit 26. That is, the physical quantity corresponding to the feedback current $I_{FB}$ described above can be, for example, the potential difference $\Delta Vx$ between the first feedback voltage $V_{FB1}$ and the second feedback voltage $V_{FB2}$.

The polarity of the second feedback voltage $V_{FB2}$ inverts the polarity of the first feedback voltage $V_{FB1}$ with respect to the predetermined reference voltage VB as the baseline. In particular, the second feedback voltage $V_{FB2}$ is an inversion of the first feedback voltage $V_{FB1}$ with respect to the predetermined reference voltage VB. Therefore, it is possible to increase the potential difference $\Delta Vx$ between the first feedback voltage $V_{FB1}$ and the second feedback voltage $V_{FB2}$. That is, it is possible to increase the feedback current $I_{FB}$. In order to increase the feedback current $I_{FB}$, the resistance of the circuit through which the feedback current $I_{FB}$ flows is not reduced, and the power supply voltage is not increased.

As described above, according to the present embodiment, it is possible to provide the magnetic detection device 1 that can increase the feedback current $I_{FB}$ flowing through the detection coil 12 without reducing a resistance of a circuit through which the feedback current $I_{FB}$ flows and without increasing a power supply voltage in a case where the magnetic detection device includes the feedback circuits 25 and 26.

Second Embodiment

Figure 7:
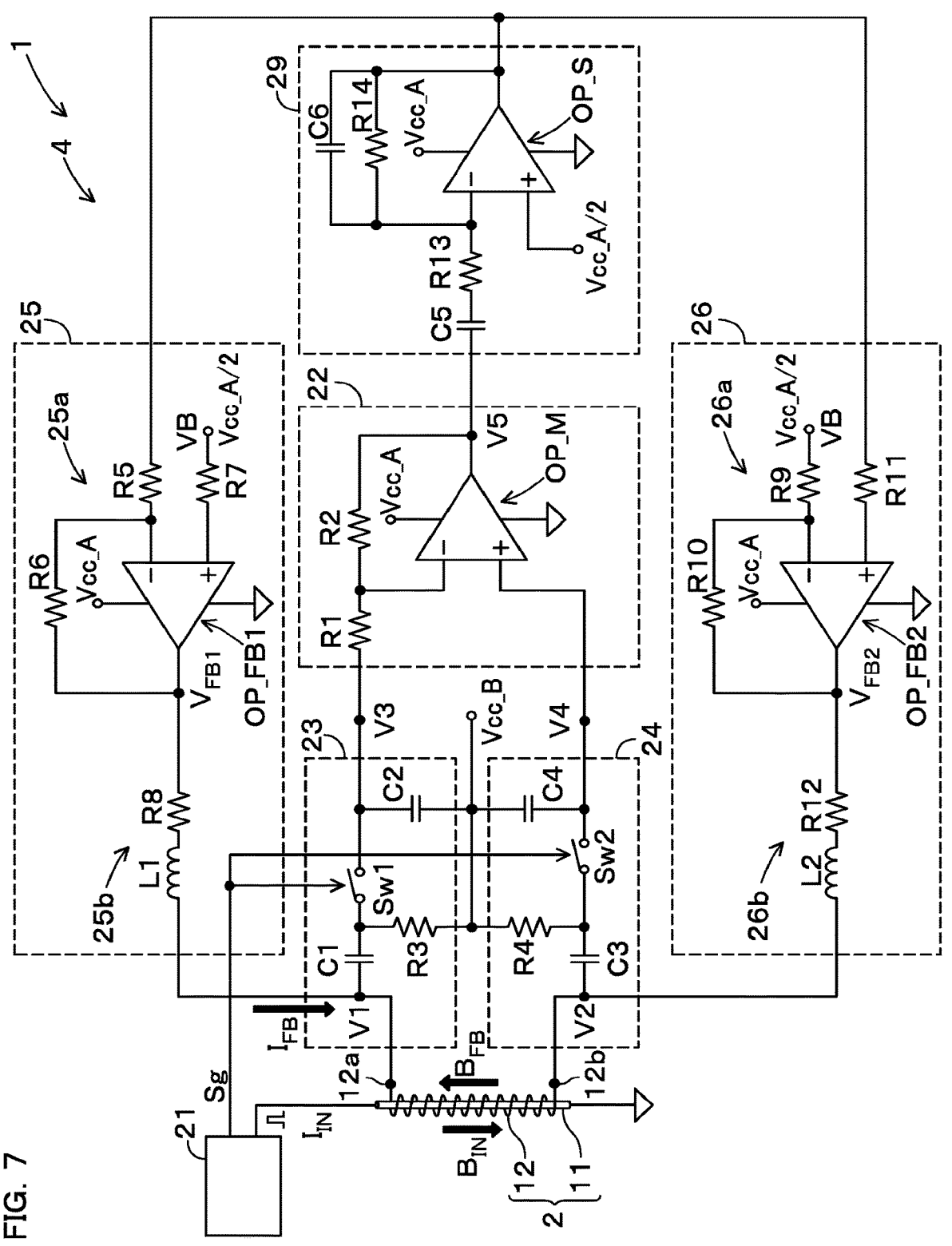
FIG. 7 is a view illustrating a configuration of a magnetic detection device according to a second embodiment.

The magnetic detection device 1 of the present embodiment will be described with reference to FIG. 7. The magnetic detection device 1 of the present embodiment includes the MI sensor element 2 and a detection circuit 4. The detection circuit 4 additionally includes a common feedback input voltage generation circuit 29 with respect to the detection circuit 3 of the first embodiment.

Components other than the common feedback input voltage generation circuit 29 are similar to those of the first embodiment. The detection circuit 4 includes the signal output unit 27 and the reference power supply 28 similarly to the detection circuit 3 of the first embodiment, which are omitted in FIG. 7. Note that among the signs used in the second embodiment, the identical signs to those used in the embodiment described above represent similar components or the like to those in the embodiment described above unless otherwise specified.

The common feedback input voltage generation circuit 29 (hereinafter, simply called a "generation circuit 29") is connected to the output terminal of the main operational amplifier OP_M, and performs at least one processing of phase adjustment processing, differentiation processing, and integration processing on the output voltage of the main operational amplifier OP_M. The generation circuit 29 generates a common feedback input voltage with respect to the first feedback circuit 25 and the second feedback circuit 26. That is, the generation circuit 29 is connected to the inverting input terminal of the first feedback operational amplifier OP_FB1 constituting the first feedback circuit 25 and the non-inverting input terminal of the second feedback operational amplifier OP_FB2 constituting the second feedback circuit 26.

The generation circuit 29 is configured by an operational amplifier OP_S. The generation circuit 29 is configured to include resistances R13 and R14 and capacitors C5 and C6 in accordance with a target function. The operational amplifier OP_S is configured by a single power supply operational amplifier.

According to the present embodiment, in a case where a voltage having been subjected to the above processing is generated as an input voltage with respect to the first feedback circuit 25 and the second feedback circuit 26, the circuit configuration can be simplified by providing the one generation circuit 29 as compared with a case where separate generation circuits are provided. Furthermore, the present embodiment also has actions and effects similar to those of the first embodiment.

Note that in a case where the generation circuit 29 is a circuit that performs differentiation processing and integration processing, the phase of an input/output signal is inverted by 180°. In this case, the non-inverting input terminal of the main operational amplifier OP_M is preferably connected to the first end 12*a* of the detection coil 12, and the inverting input terminal is preferably connected to the second end 12*b* of the detection coil 12.

OTHERS

In the first and second embodiments, each of the operational amplifiers OP_M, OP_FB1, OP_FB2, and OP_S is configured by a single power supply operational amplifier, but may be configured by a dual power supply operational amplifier. In this case, the predetermined reference voltage VB is not a positive voltage but can be near the ground potential.

In the first embodiment, the first feedback circuit 25 and the second feedback circuit 26 are directly connected to the output terminal of the main amplifier circuit 22. Other than that, an A-D conversion circuit and a D-A conversion circuit may be connected so as to interpose. Due to this, it is also possible to perform digital signal processing.

The invention claimed is:
1. A magnetic detection device comprising:
a magnetoimpedance sensor element comprising a magnetic sensitive body that is configured to cause a magnetization change corresponding to a strength of a magnetic field when an excitation current is supplied, and a detection coil that is wound around the magnetic sensitive body and is configured to output an induced voltage caused by the magnetization change of the magnetic sensitive body;
a main operational amplifier comprising an inverting input terminal and a non-inverting input terminal, one of which is connected to a first end of the detection coil, and an other of which is connected to a second end of the detection coil opposite to the first end;
a first feedback circuit that is connected between an output terminal of the main operational amplifier and the first end of the detection coil and is configured to generate a first feedback voltage for causing a feedback current in the detection coil; and
a second feedback circuit that is connected between the output terminal of the main operational amplifier and the second end of the detection coil and is configured to generate a second feedback voltage with a polarity that inverts a polarity of the first feedback voltage with respect to a predetermined reference voltage as a baseline for causing the feedback current in the detection coil.
2. The magnetic detection device according to claim 1, wherein the first feedback circuit comprises a first feedback operational amplifier having an input terminal connected to an output terminal side of the main operational amplifier and an output terminal connected to the first end side of the detection coil,
wherein the second feedback circuit comprises a second feedback operational amplifier having an input terminal connected to the output terminal side of the main operational amplifier and an output terminal connected to the second end side of the detection coil,
wherein the first feedback voltage is a voltage of the output terminal of the first feedback operational amplifier, wherein the second feedback voltage is a voltage of the output terminal of the second feedback operational amplifier, and
wherein in the input terminal connected to the output terminal side of the main operational amplifier in the first feedback operational amplifier and the input terminal connected to the output terminal side of the main operational amplifier in the second feedback operational amplifier, one of the input terminals is the inverting input terminal, and an other of the input terminals is the non-inverting input terminal.
3. The magnetic detection device according to claim 2, wherein an amplification factor of the first feedback circuit and an amplification factor of the second feedback circuit are set to be identical, and
wherein the second feedback voltage is an inversion of the first feedback voltage with respect to the predetermined reference voltage as the baseline.
4. The magnetic detection device according to claim 2, wherein the first feedback circuit comprises the first feedback operational amplifier, and a first impedance circuit that is connected between the output terminal of the first feedback operational amplifier and the first end of the detection coil and is configured to suppress movement of the induced voltage output by the detection coil to the first feedback operational amplifier side, and
wherein the second feedback circuit comprises the second feedback operational amplifier, and a second impedance circuit that is connected between the output terminal of the second feedback operational amplifier and the second end of the detection coil and is configured to suppress movement of the induced voltage output by the detection coil to the second feedback operational amplifier side.
5. The magnetic detection device according to claim 4, wherein an impedance of the first impedance circuit and an impedance of the second impedance circuit are set to be identical.
6. The magnetic detection device according to claim 1, further comprising:
a common feedback input voltage generation circuit that is connected to the output terminal of the main operational amplifier, is configured to perform a processing selected from the group consisting of a phase adjustment processing, a differentiation processing, and an integration processing on an output voltage of the main operational amplifier, and is configured to generate a common feedback input voltage with respect to the first feedback circuit and the second feedback circuit.
7. The magnetic detection device according to claim 1, further comprising:
a first input circuit that is connected between the first end of the detection coil and the inverting input terminal of the main operational amplifier, is configured to hold a voltage of the first end at a predetermined timing, and is configured to input a held voltage of the first end to the inverting input terminal of the main operational amplifier; and
a second input circuit that is connected between the second end of the detection coil and the non-inverting input terminal of the main operational amplifier, is configured to hold a voltage of the second end at an identical timing to the predetermined timing, and is configured to input a held voltage of the second end to the non-inverting input terminal of the main operational amplifier.

8. The magnetic detection device according to claim 1, wherein the predetermined reference voltage is a positive voltage.

9. The magnetic detection device according to claim 8, further comprising a common reference power supply that is configured to apply the positive voltage as the predetermined reference voltage to the first feedback circuit and the second feedback circuit.

10. The magnetic detection device according to claim 1, further comprising:

a signal output unit that is configured to output a potential difference between the first feedback voltage and the second feedback voltage, or the feedback current, as a detection signal indicating a strength of a detection target magnetic field acting on the magnetic sensitive body.

\* \* \* \* \*